(12) United States Patent
Deng et al.

(10) Patent No.: US 7,277,179 B2
(45) Date of Patent: Oct. 2, 2007

(54) MAGNETO-OPTICAL SENSORS

(75) Inventors: Kung-Li Justin Deng, Waterford, NY (US); Glenn Alan Forman, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 309 days.

(21) Appl. No.: 11/010,530

(22) Filed: Dec. 13, 2004

(65) Prior Publication Data

US 2006/0126990 A1    Jun. 15, 2006

(51) Int. Cl.
   *G01B 9/02*    (2006.01)
(52) U.S. Cl. .................. 356/483; 356/478; 356/461
(58) Field of Classification Search ............... 356/483, 356/495, 460, 479, 480, 461, 478; 250/227.27, 250/227.17, 227.19; 324/96
   See application file for complete search history.

(56) References Cited

U.S. PATENT DOCUMENTS

| | | | | |
|---|---|---|---|---|
| 4,375,680 | A * | 3/1983 | Cahill et al. ................. | 367/149 |
| 4,542,338 | A * | 9/1985 | Arditty et al. .......... | 324/117 R |
| 5,108,183 | A * | 4/1992 | Fling et al. ................. | 356/460 |
| 5,564,832 | A | 10/1996 | Ball et al. | |
| 5,644,397 | A * | 7/1997 | Blake ........................ | 356/483 |
| 6,188,811 | B1 * | 2/2001 | Blake ........................ | 385/12 |
| 6,301,400 | B1 | 10/2001 | Sanders | |
| 6,434,285 | B1 | 8/2002 | Blake et al. | |
| 6,542,651 | B2 * | 4/2003 | Bennett ...................... | 385/12 |
| 6,670,799 | B1 | 12/2003 | Bull et al. | |

FOREIGN PATENT DOCUMENTS

| | | |
|---|---|---|
| EP | 0 783 701 B | 5/1998 |
| EP | 1195582 | 4/2002 |
| EP | 1 310 802 A2 | 5/2003 |
| JP | 2001281272 | 10/2001 |
| JP | 2004301769 | 10/2004 |
| WO | WO 94/00768 | 1/1994 |

OTHER PUBLICATIONS

"Current Sensing by Mode Coupling in Fibre via the Faraday Effect", Jan. 31, 1991, Electronics Letters, vol. 27, No. 3, pp. 207-208.

W. Chu, et al "Magneto-Optic Current Sensor Using a Highly-Linear Birefringent Optical Fibre", May 29, 1992, Fibre Optics Sensor Technology, IEE Colloquium on pp. 7/1-7/3.

A.J. Rogers, et al, "Vibration Immunity for Optical-Fibre Current Measurement", Jul. 1995, Journal of Lightwave Technology, vol. 13, No. 7, pp. 1371-1377.

(Continued)

*Primary Examiner*—Hwa (Andrew) Lee
(74) *Attorney, Agent, or Firm*—Ann M. Agosti; Patrick K. Patnode

(57) ABSTRACT

A system for estimating a parameter selected from the group consisting of a current, a magnetic field, or combinations thereof comprises a resonant frequency tunable magneto-optical loop resonator, wherein the loop resonator comprises a magneto-optical sensing element coupled to an optical waveguide, and wherein the loop resonator is configured for receiving an originating optical signal from a broadband light source and providing a modulated signal indicative of the estimated parameter.

36 Claims, 12 Drawing Sheets

OTHER PUBLICATIONS

J. Song, et al, "A Prototype Clamp-on Magneto—optical Current Transducer for Power System Metering and Relaying", Oct. 4, 1995, IEEE Transactions on Power Delivery, vol. 10, No. 4.

Y.N. Ning, et al "Recent Progress in optical current sensing techniques", May 1995, Rev. Sci. Instrum., vol. 66, No. 5, pp. 3097-3111.

A. Kung, et al "Reciprocal and Quasi-Reciprocal Brillouin Fiber-Optic Current Sensors", Dec. 1996, IEEE Photonics Technology Letters, vol. 8, No. 12.

"Magneto-Optical Fibre Sensors for Electrical Industry: Analysis of Performances", IEE Proceedings J. Optoelectronics, Institution of Electrical Engineers. Stevenage, GE, vol. 135, No. 5, part J. Oct. 1, 1988, pp. 372-382, XP00027004.

EPO Search Report dated Mar. 14, 2006.

\* cited by examiner

MAGNETO-OPTICAL SENSORS

BACKGROUND

The invention relates generally to sensors. The invention particularly relates to magneto-optical current and magnetic field sensors.

Conventional transformer-based current sensors are large in size for field operations and tend to saturate at high voltages or currents. Alternative current sensors, such as optical current sensors, typically rely upon the Faraday effect of the magnetic field created by the current to alter the polarization of light propagating in a fiber near the conductor. The method for extracting this information from the fiber is very intricate and costly. In one example, complex active power supplies are located at line potential. Fiber-optic current sensors based on polarimetric methods require stringent control on the polarization state. The components for polarization measurement are usually based on costly bulk optical components and maintaining the alignment through a number of these types of components becomes a challenging task. Furthermore, cascading polarimetric current sensors for distributed sensing applications may not be practical due to system complexity.

Measurement of currents flowing in high-voltage environments is also highly desirable, especially in power transmission and distribution systems. Transmission and distribution systems react dynamically to changes in active and reactive power. For power transmission to be economical and the risk of power system failure to be low, reactive compensation systems are desirable, particularly systems capable of simultaneously monitoring current flow at several points on a grid.

There is a need therefore for low cost current metering and instrumentation. There is a particular need for a current measuring system that allows for multiplexing, which can be economically scaled and used in applications where instrumentation of multiple channels is required.

BRIEF DESCRIPTION

Briefly, in accordance with one embodiment of the present invention, a system for current or magnetic field parameter determination comprises a resonant frequency tunable magneto-optical loop resonator, wherein the loop resonator comprises a magneto-optical sensing element coupled to an optical waveguide, and wherein the loop resonator is configured for receiving an originating optical signal, propagating the signal in two counter directions, and providing a modulated signal indicative of the parameter.

In accordance with another embodiment of the present invention, a system for current or magnetic field parameter determination comprises a plurality of resonant frequency tunable magneto-optical loop resonators, wherein each loop resonator comprises a magneto-optical sensing element coupled to an optical waveguide, and wherein the loop resonators are configured for receiving an optical signal, propagating the signal in two counter directions, and providing a modulated signal indicative of the parameter.

In accordance with one aspect of the present invention, a method for current or magnetic field parameter determination comprises providing at least one frequency tunable magneto-optical loop resonator, positioning the loop resonator in a magnetic field to be sensed, coupling an originating signal from a source into the at least one loop resonator, propagating the originating signal through two arms of the loop resonator and detecting a modulated signal from the at least one resonator.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As used herein, "adapted to", "configured" and the like refer to devices in a system to allow the elements of the system to cooperate to provide a described effect; these terms also refer to operation capabilities of electrical or optical elements such as analog or digital computers or application specific devices (such as an application specific integrated circuit (ASIC)), amplifiers or the like that are programmed to provide an output in response to given input signals, and to mechanical devices for optically or electrically coupling components together.

As used herein, the term "current" can refer to either alternating current (AC) or direct current (DC).

The drawings and illustrations herein are for the purpose of describing an embodiment or aspect of the invention and are not intended to limit the invention.

Figure 1:
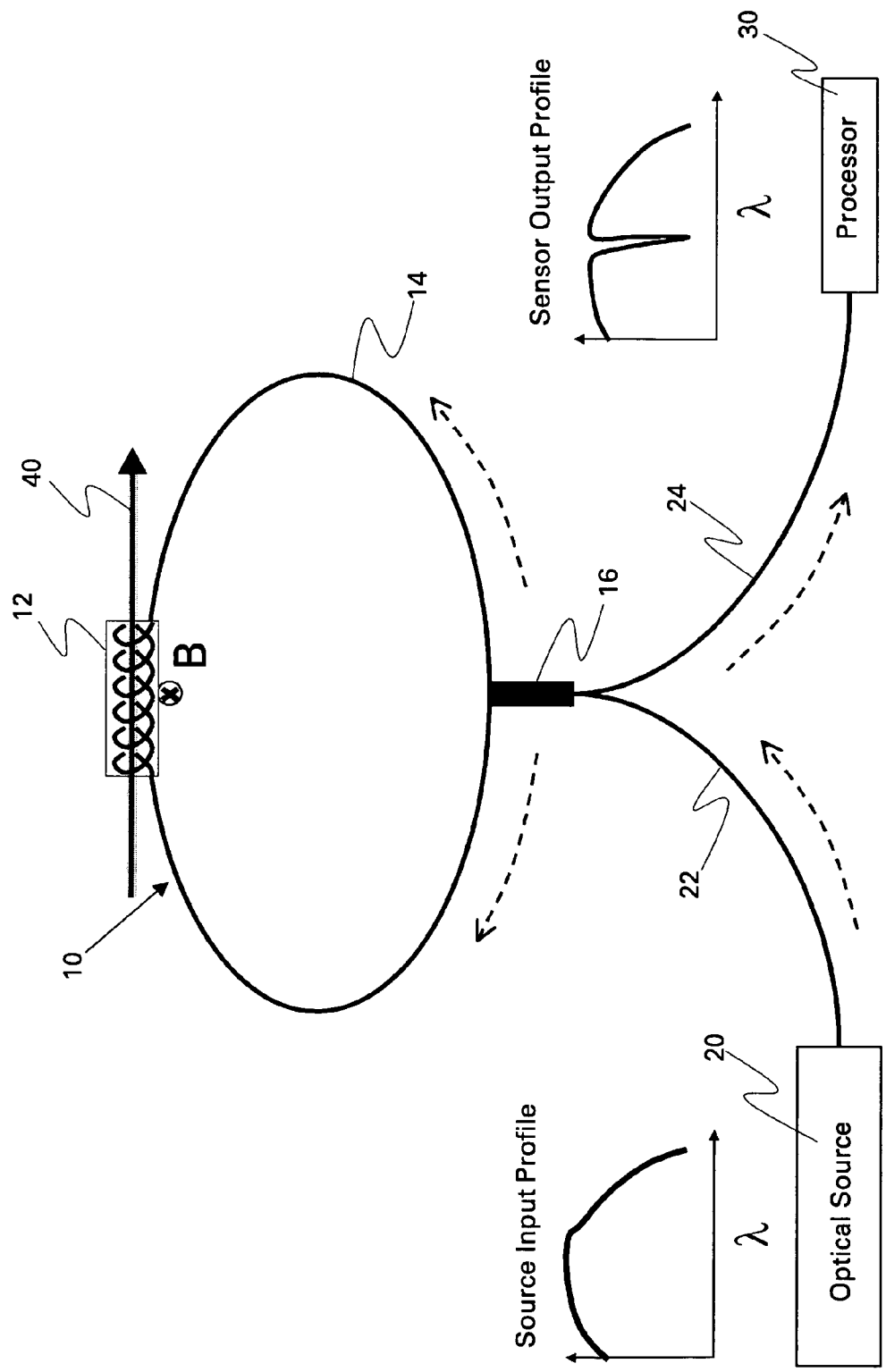
FIG. 1 is a schematic view of a system in accordance with a first embodiment of the present invention.

Embodiments of the present invention relate to magneto optical sensors for estimating a parameter selected from the group consisting of a current, a magnetic field, or combinations thereof. In one embodiment of the present invention, as shown in FIG. 1, a resonant frequency tunable magneto-optical loop resonator 10, is configured to receive an originating optical signal and to counter propagate the signal through the resonator. The loop resonator comprises a magneto-optical sensing element 12 coupled to a waveguide 14 to form a resonator structure. The waveguide may comprise either a guided waveguide, such as but not limited to an optical fiber or a thin-film wavepuide, or may comprise a free- space beam. Light splitter 16, which may comprises a beam splitter, fiber, or waveguide directional coupler, for example, separates the incoming light into the two counter-propagating arms of the loop resonator. The loop resonator 10 is further configured to send a recombined signal or modulated signal out of the loop resonator into a transmitted port (shown as optical fiber 24) and reflected port (shown as optical fiber 22).

Faraday rotation is the rotation of polarization of light by a magneto-optic material due to the presence of a magnetic field parallel to the direction of propagation of light. Faraday effect induced non-reciprocal phase shift or non-reciprocal refractive index shift is a change in the velocity of propagation in the presence of a magnetic field parallel to the direction of propagation of light. This change reverses sign if either the field or the propagation direction is reversed. The non-reciprocal phase shift is proportional to the Faraday rotation or the Verdet constant of the material.

The current I in a conductor is proportional to the line integral of the magnetic flux density B enclosed by a closed loop s, and is given by $$\oint_c \vec{B} \cdot d\vec{s} = \mu_0 I, \tag{1}$$

where $\mu_0$ is the permeability of free space.

If a magneto-optical sensing element is placed in the magnetic field of a current carrying conductor, a light propagating through a magneto-optical sensing element in a direction parallel to the magnetic field intensity H, experiences a non reciprocal phase shift due to Faraday effect. The non-reciprocal phase shift $\Delta\phi$ is given by $$\Delta\Phi = \oint_c V(\vec{H} \cdot d\vec{l}) = \oint_c V\left(\frac{\vec{B}}{\mu_0} \cdot d\vec{l}\right) = VI, \tag{2}$$

where V is the Verdet constant of magneto-optical sensing element material and I the current flowing through the conductor along a unit length dl.

The phase shift reverses sign if either the field or the propagation direction is reversed. Therefore the phase shift change between counter two propagating light waves is given by $$\Delta\Phi = 2VI. \tag{3}$$

If the magneto-optical sensing element is a coiled optical fiber element with N turns, then the phase shift is given by $$\Delta\Phi = 2NVI. \tag{4}$$

The resonant frequency f of a loop resonator is a function of the refractive index n of the resonator material and the length $L_1$ of the loop resonator. The free spectral range (FSR), the frequency spacing between two adjacent modes of the resonator, is given by $$FSR = c/2nL_1, \tag{5}$$

where c is the velocity of light.

If a resonator loop with a magneto-optical sensing element with counter propagating light waves is placed in the magnetic field of a current carrying conductor, the resonance frequency of the loop resonator will be a sensitive function of the non-reciprocal phase changes experienced by the two counter-propagating light waves in the loop. The resonant frequency of the resonator (or wavelength) is obtained by the frequency filtered by the resonator and can give a precise estimation of the applied magnetic field. The non-reciprocal index change within the resonator results in a frequency shift $\Delta f$ of the resonant frequency. A phase shift of $2\pi$ corresponds to a frequency shift equal to the FSR. Therefore, the non-reciprocal phase shift corresponding to a frequency shift $\Delta f$ is given by $$\Delta\Phi = 2NVI = \Delta f \times 2\pi/(c/2nL_1). \tag{6}$$

The estimated current for a single loop resonator is therefore given by $$I = \Delta f \times 2\pi n L_1/(cNV). \tag{7}$$

If a ring filter with a resonator length $L_2$ is coupled to the loop resonator with the sensing element, the estimated current is then given by $$I = \Delta f \times 2\pi n(\Delta L)/(cNV), \tag{8}$$

where $\Delta L$ is $L_1-L_2$, the difference in resonator lengths.

Obtaining the frequency of the resonator or the frequency filtered by the resonator can provide a precise estimation of the applied magnetic field. The current carried through the conductor can then be estimated. All other effects such as stress and temperature are reciprocal in regards to the counter-propagating light inside the loop, such that the relative phase noises cancel each when the two waves combine at the light splitter 16.

In the embodiment shown in FIG. 1, a non-limiting example of the magneto-optical sensing element 12 includes a coiled optical fiber element. The optical fiber coil may be looped around the current carrying conductor in several turns to sense the magnetic field. In one embodiment of the sensing element, the sensing element comprises an erbium or ytterbium doped multiple-turn coiled optical fiber element. For example, the number of turns in a multiple-turn coiled optical fiber element coil is about 200.

Non-limiting examples of optical waveguides 14 include optical fibers, waveguide structures including glass, polymer waveguide structures, semiconductor material waveguide structures or period of free-space connection structures. Loop resonators with optical waveguides of different geometries, different mode structures and varying refractive index distribution are within the scope of this invention An optical source 20 is configured for sending an originating optical signal that is coupled into at least one magneto-optical loop resonator 10 through an optical fiber 22. A non-limiting example of an optical source 20 includes a broadband source. A broadband source is defined as a source or collection of sources capable of emitting light over a range of wavelengths. The broadband source may comprise a single wavelength tunable laser or a multi-wavelength broadband laser, for example. At least one light splitter 16 is used to couple the originating signal into the loop resonator and the modulated signal out of the loop resonator.

A processor 30 is configured for receiving the modulated signal from the magneto-optical loop resonator 10 through an optical fiber 24. Typically, the processor also functions as a wavelength demultiplexer to resolve the resonance responses from each sensor. The processor may include one or more wavelength de-multiplexing elements, optical spectral meters, wavelength meters, photodetectors, differential amplifiers, and analog to digital converters. The wavelength demultiplexing element may comprise an array waveguide grating, a transmission or a deflection grating with a detection circuit tunable device such as a Fabry Perot interferometer, a ring resonator or a filter, for example. In a further embodiment of the present invention, the processor 40 and the optical source 30 are integrated into a single unit to form an optical interrogator module 50. In still further an embodiment of the present invention, part of the originating signal is sent to the processor as a reference signal to help extract a substantially accurate parameter value.

Figure 2:
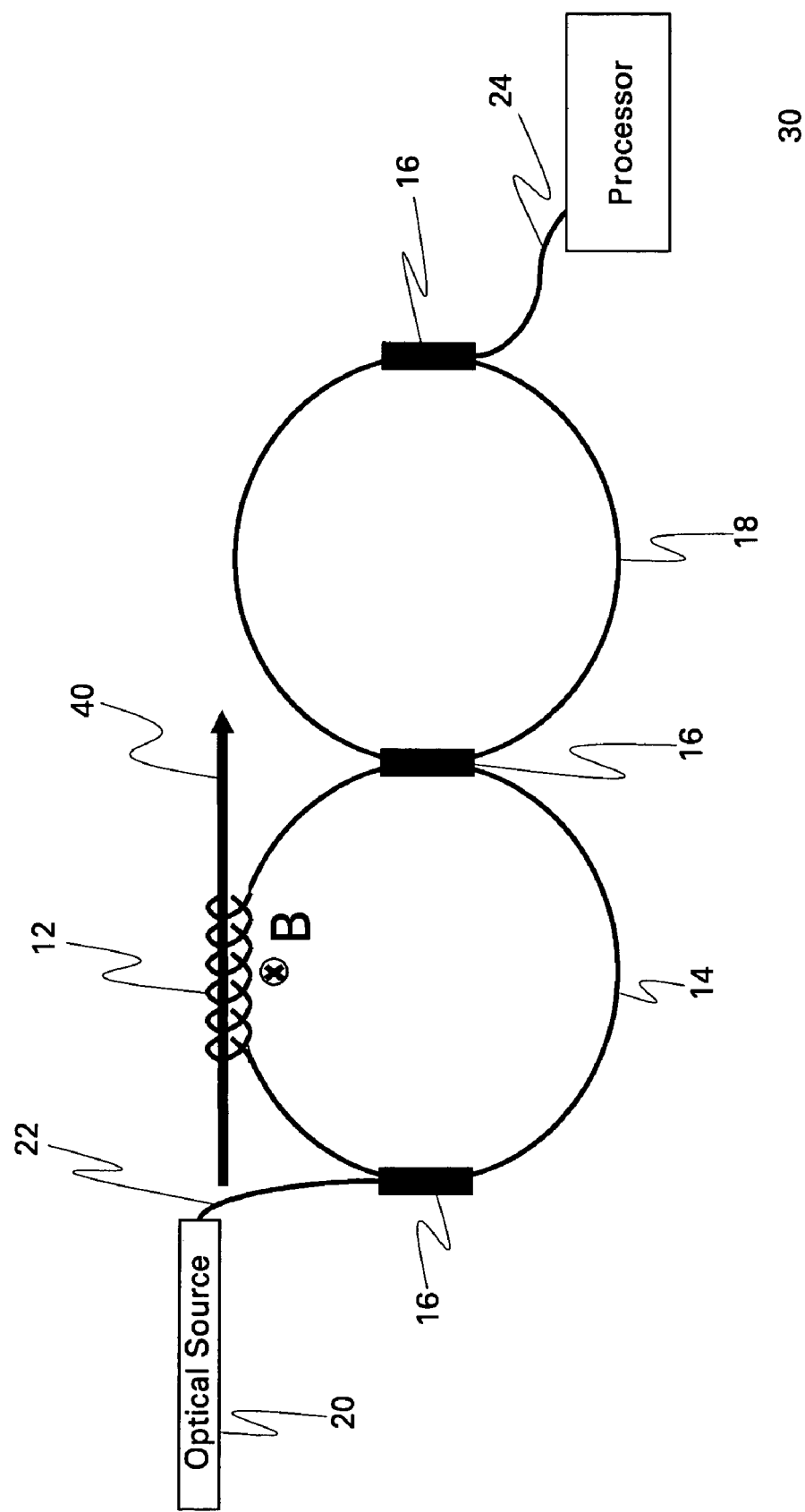
FIG. 2 is a schematic view of a system in accordance with a second embodiment of the present invention.

In another embodiment of the present invention as shown in FIG. 2, the magneto-optical loop resonator 10 is coupled to at least one ring filter 18. This enables the adjustment of a wide range of parameters such as Free Spectral Ranges (FSR), Full Width Half Maximum (FWHM) and filter finesse. Furthermore, the ring filter can be used as a reference for temperature compensation of the loop resonator. Non-limiting examples of a ring filter include a loop resonator and a ring resonator. By choosing a desired coupling ratio, the frequency characteristics of the loop resonator-ring filter combination can be configured.

In a non-limiting example, a magneto-optical loop resonator with a 200-turn optical fiber sensing element is coupled to a resonator filter, wherein the difference in resonator lengths $\Delta L$ is in the range of about 0.01 mm to about 0.1 mm. A lower $\Delta L$ value results in higher frequency resolution and higher accuracy in the estimated current. Such a system would typically exhibit a sub-nanometer resolution and could, for example, estimate a 3000 ampere current flowing through a conductor with an accuracy of 1% or better.

Figure 3:
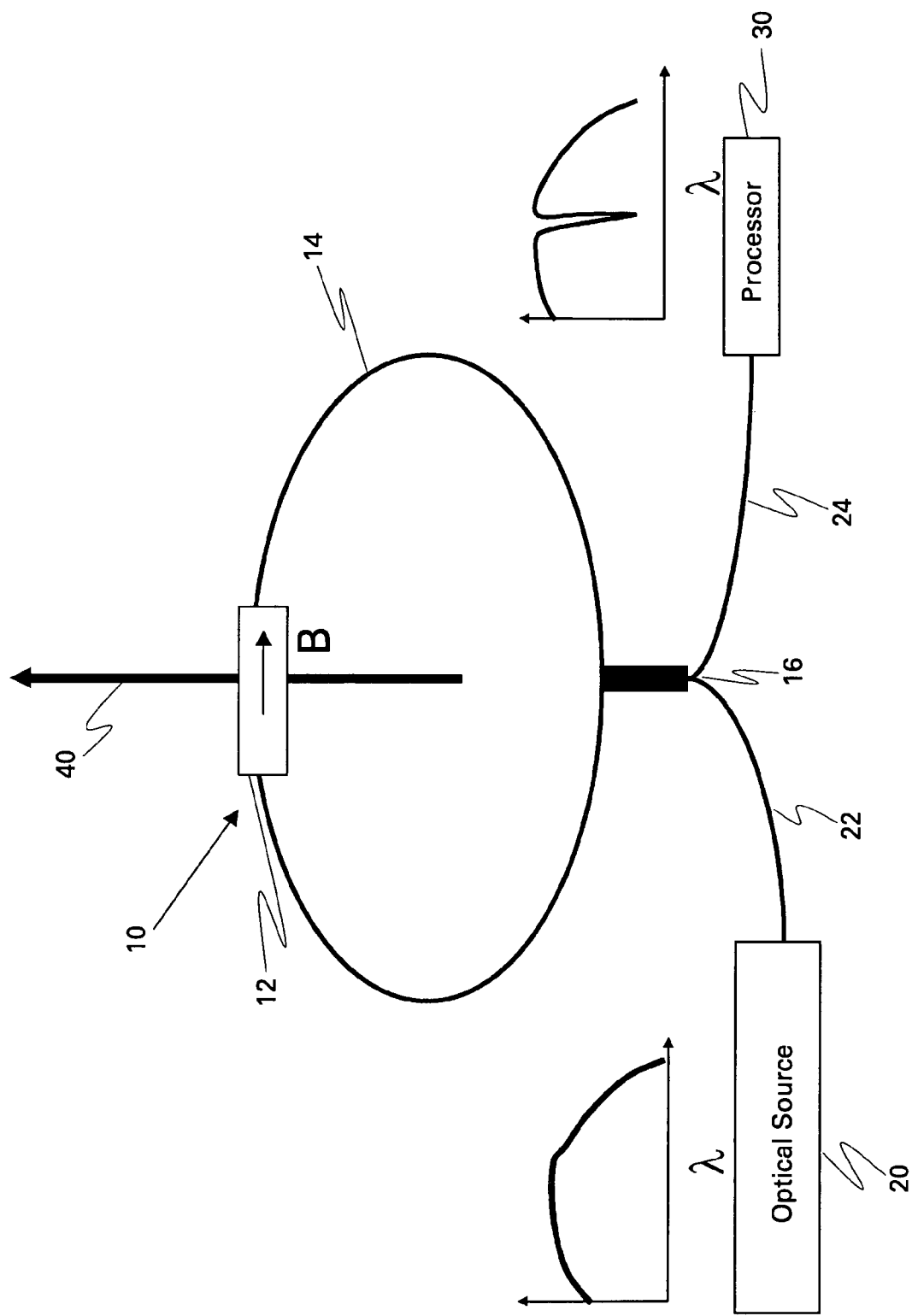
FIG. 3 is a schematic view of a system in accordance with a third embodiment of the present invention.

In a further embodiment of the present invention as shown in FIG. 3, the magneto-optical sensing head 12 is a magneto-optical crystal 12 with a desirable Verdet constant. Non-limiting examples of magneto-optical crystals include terbium gallium garnet (TGG), terbium doped borosillicate glass, rare earth ion, erbium doped glass, ytterbium doped glass or LiNbO3.

The above described embodiments were primarily described in terms of a single magneto-optical loop resonator sensor, an optical source, and a processor, for purposes of example, however, each system may include one or more of such elements and "a" as used herein is intended to mean "at least one." When a plurality of loop resonators are used, the output signal from one loop resonator may be coupled into the input of a second loop resonator. In one example, a system in accordance with an embodiment of the present invention has at least two of the magneto optical loop resonators having different resonant frequencies. In a second example, the system has at least two resonators with the same resonant frequency.

Figure 4:
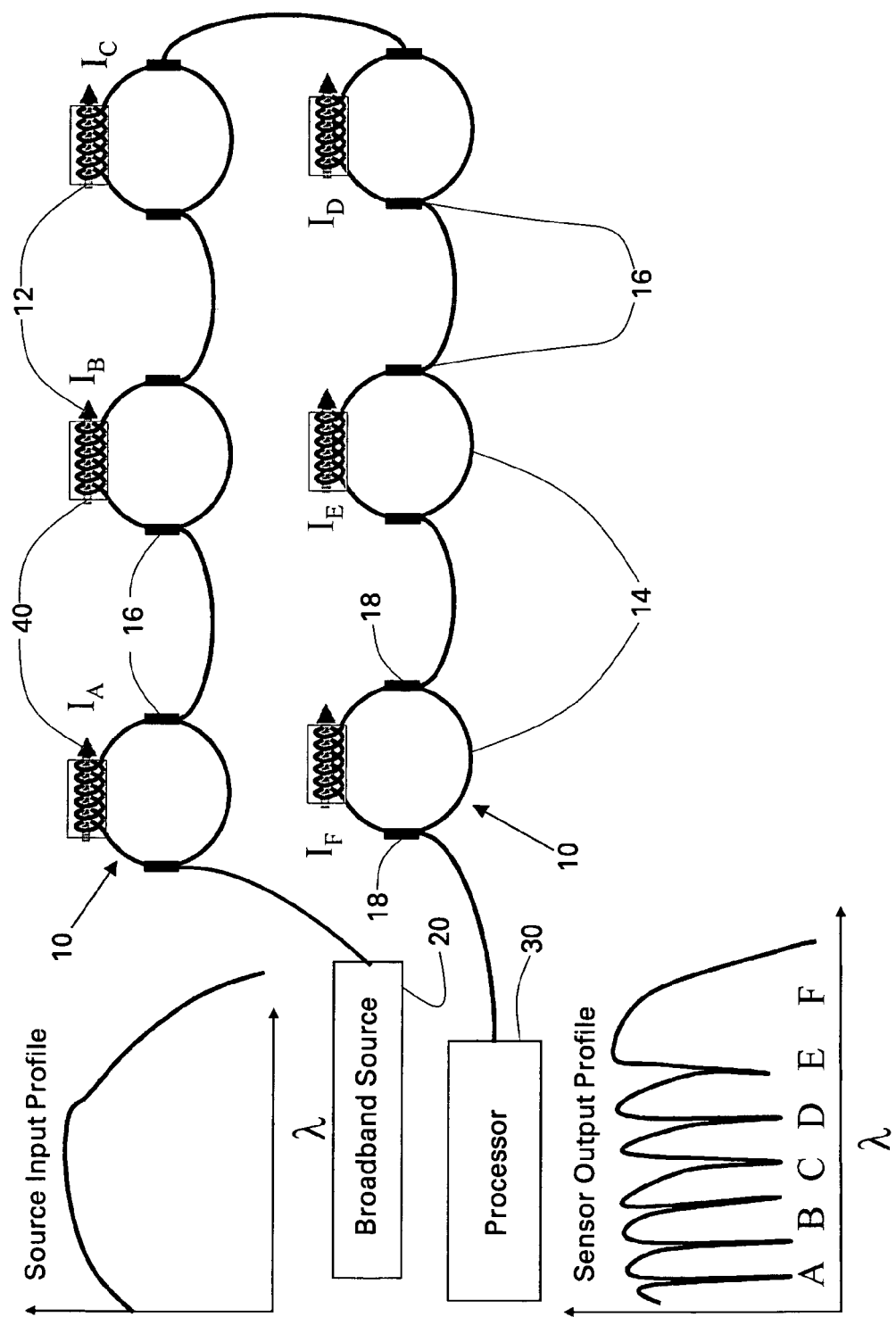
FIG. 4 is a schematic view of a distributed current sensing system in accordance with one embodiment of the present invention.

One embodiment of the present invention where a plurality of magneto-optical loop resonators is used is a distributed current estimation system as shown in FIG. 4. The sensors are used in a distributed architecture with magneto optical loop resonators 10 with different resonant frequencies being located in multiple locations to sense current flowing through different conductors 40. An originating signal from a broadband source 20 is coupled into the input of a first loop resonator 10. The modulated signal from the final resonator is input into the processor. The sensors can be cascaded and can be remotely distinguished by their different resonant frequency.

In one embodiment of the present invention, the distributed current estimation system is embodied in a power substation. In a power grid, power distribution to multiple transmission lines typically occurs in a power substation. Desirably, a power station includes a distributed current estimation system to monitor current flow in multiple transmission lines.

In another embodiment of the present invention, the distributed current estimation system is embodied in a power monitoring system in a transportation system. In a non-limiting example, a transportation system, wherein electrical power generation and distribution occurs within the transportation system, includes a power monitoring system comprising a distributed current estimation system for sensing current.

Figure 5:
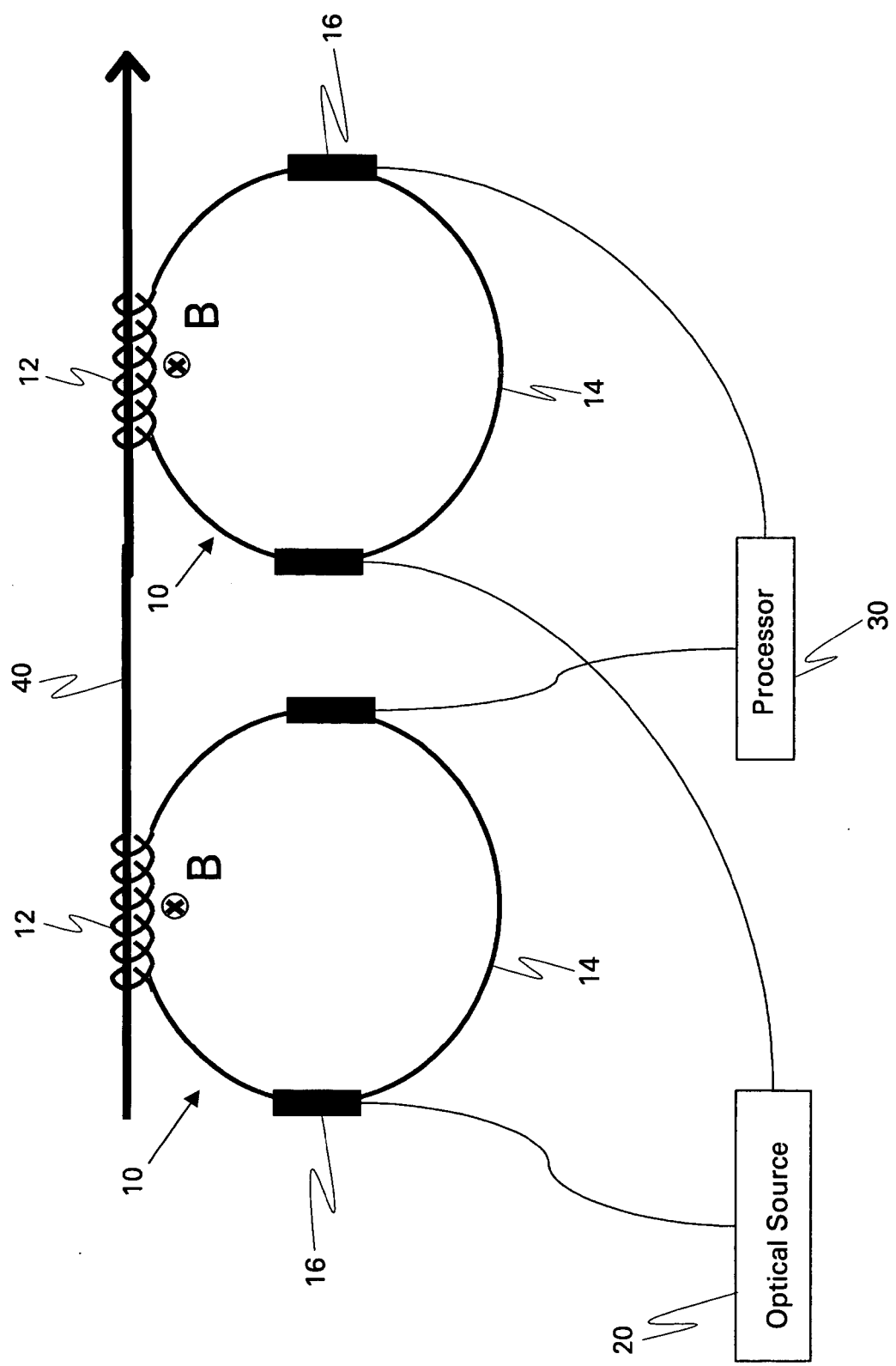
FIG. 5 is a schematic view of a differential-current sensing system in accordance with one embodiment of the present invention

An embodiment of the present invention where a plurality of magneto-optical loop resonators are used, is a differential current estimation system as shown in FIG. 5. It is desirable to have a system to estimate the difference between current flowing at two points along the same conductor. Such measurements may be used for differential fault current relaying in electric power systems. Difference in current can also provide information about the condition of the insulation surrounding the conductor. For example, small leakage currents to ground, through defective insulation at one point along a conductor, will typically lead to unequal currents being estimated at two points on either side of the defective insulation.

The system is capable of obtaining the differential signal between current flowing at two points along the same conductor. At least two magneto-optical loop resonator sensors 10 are placed in the field of a current carrying conductor 40 at different points along the same conductor. The optical signal from an optical source 20 is coupled into each loop resonator and the modulated optical signal from each loop resonator is detected and processed by a processor 30 to extract the difference current between two points in a conductor.

In another embodiment of the present system is a ground fault detection system. In one example, a ground fault detection system comprises two or more magneto-optical sensors configured to measure current in two or more conductors or power lines to measure unbalanced load in the conductors or power lines. Such a ground fault detection system can be implemented in a three-phase AC system with a balanced load, to detect any imbalance in the system and is within the scope of this invention.

Figure 6:
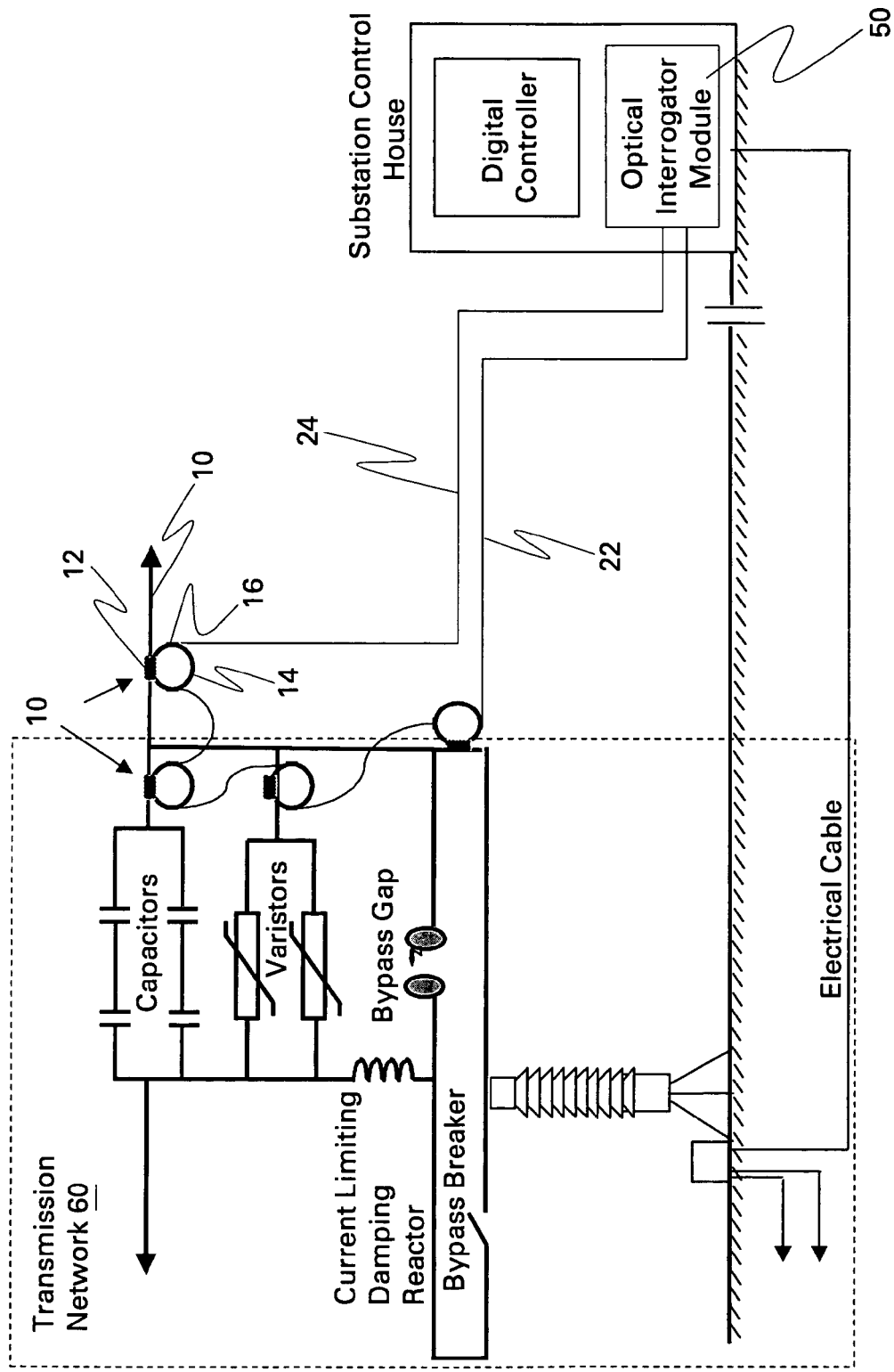
FIG. 6 is a schematic view of a reactive compensation system incorporating an embodiment of a current system in accordance with an embodiment of the present invention.

In an illustrated embodiment in accordance with the present invention as shown in FIG. 6 is a reactive compensation system for power transmission and distribution (T&D) networks. In reactive compensation systems for power T&D networks several magneto-optical loop resonators 10 with magneto-optic sensing elements 12 completely isolated from ground potential are mounted at several points on conductors in a transmission network 60. Each loop resonator may further be coupled to at least one ring filter 18. The optical interrogator module 50 interrogates the sensors by sending an originating broadband signal along at least one optical fiber 22. Each loop resonator sensor 10 is configured to respond in different wavelength regions. The loop resonator sensor responds to changes in current causing the filtered frequency to change. The optical interrogator module 50, from at least one optical fiber 24, receives the resulting modulated optical signal. The optical signal originating from different magneto-optical sensors is demultiplexed by demultiplexers, and converted to electric signals by photodetectors housed in the optical interrogator module 50. The signal is further processed and the information on current flow at various points on the network is passed on to a controller to enable dynamic control of the power flow in the system.

In an aspect of the present invention, a method for estimating a parameter selected from the group consisting of a current, a magnetic field, or combinations thereof, comprises the steps of providing at least one frequency tunable magneto-optical loop resonator with a sensing element, positioning the sensing element in a magnetic field to be sensed, coupling an originating signal from a source into the at least one loop resonator; propagating the originating signal along two counter propagating directions through two arms of the loop resonator and detecting a modulated signal from the at least one resonator. The method further includes providing a processor for determining the value of the parameter. The method further includes configuring the processor for difference current estimation.

In a further aspect of this invention a method for estimating a parameter selected from the group consisting of a current, a magnetic field, or combinations thereof includes configuring multiple resonators with different resonant frequencies and positioning them in the magnetic field of different conductors to form a distributed network, sending an originating signal through the multiple loop resonators, configuring the processor for demultiplexing the received modulated signal and estimating the parameter.

In an embodiment, which may be an alternative or used in combination with the frequency-multiplexing embodiment, a time division-multiplexing scheme is used. In this embodiment, modulated signals from the magneto-optical sensors are resolved by observing the signals at different times. In such an embodiment the magneto-optical sensors are connected at different fiber lengths to the source and or the processor, the time of arrival of modulated signals will be different for each sensor.

EXAMPLE

Figure 7:
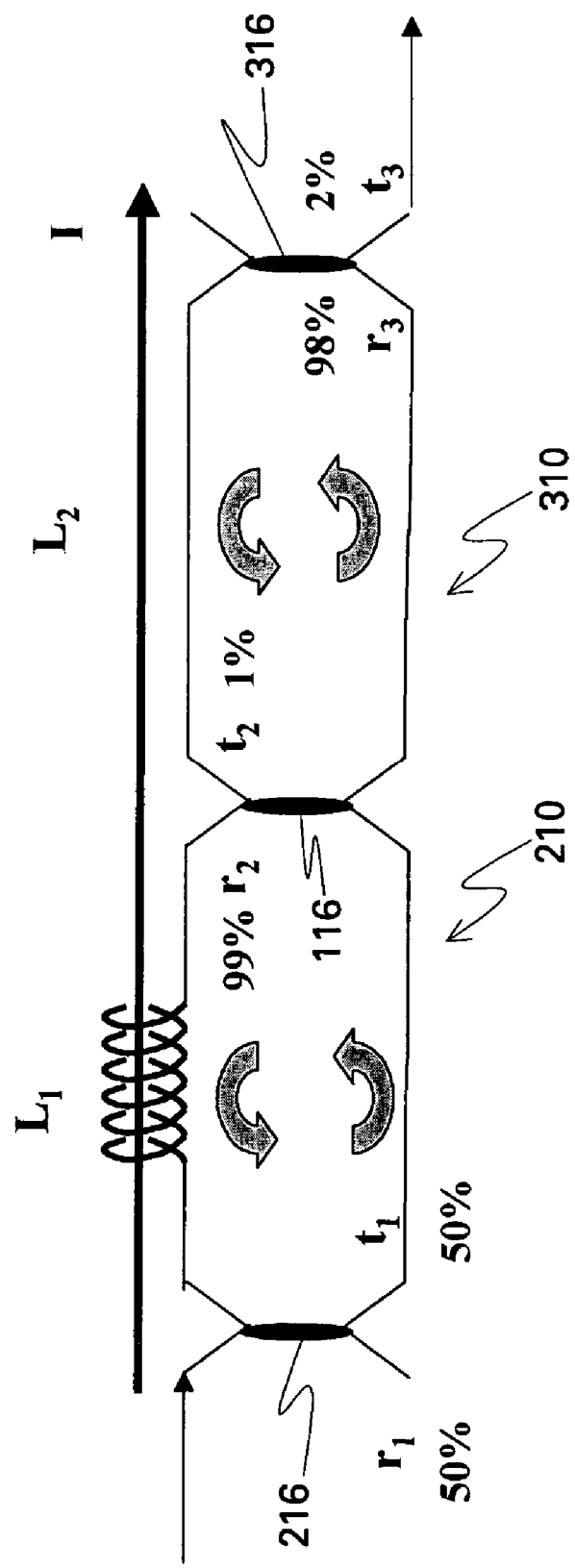
FIG. 7 is a schematic view of a double ring system in accordance with one example of the present invention.
Figure 8:
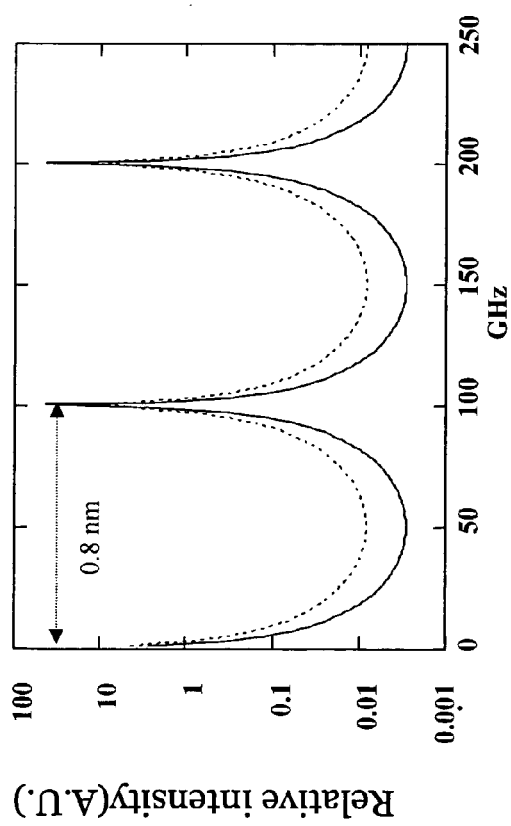
FIG. 8 is a graph illustrating expected spectral responses of the double ring system for the example of FIG. 7.
Figure 9:
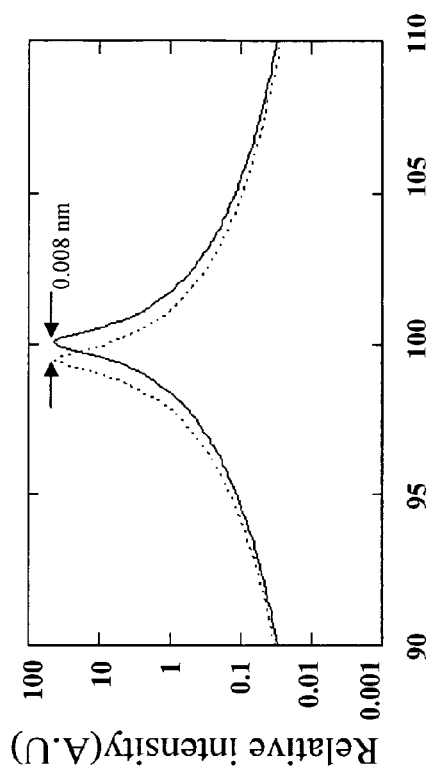
FIG. 9 is an enlarged view of a section of interest in the graph of FIG. 8.
Figure 10:
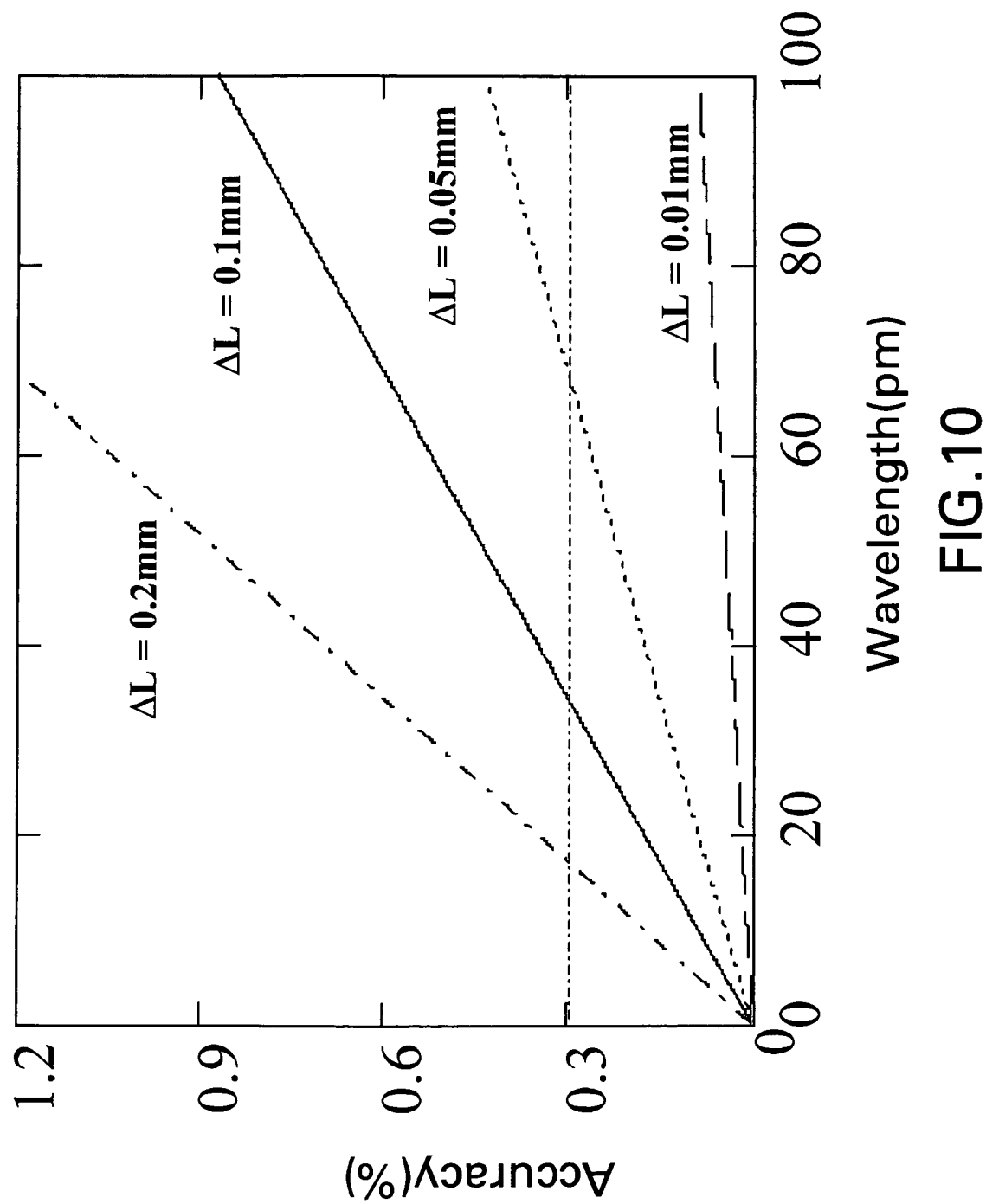
FIG. 10 is a graph illustrating expected accuracy vs. wavelength resolution and differential length for the example of FIG. 7.

A non-limiting example is illustrated in FIG. 7. Two resonators 210 and 310, each with different loop length $L_1$ and $L_2$, are coupled with a 99:1 coupler 116. An input coupler 216 in resonator 210 is 50:50 and an output coupler 316 in resonator 310 is 98:2. The coupling ratios in the couplers are chosen to optimize the spectral responses per as shown in FIGS. 8 and 9 (graphs illustrating an expected spectral response of the double ring system for the example of FIG. 7) with the solid line representing the system at room temperature and the dashed line representing the system at a temperature of about 200 degrees Celsius above room temperature. The temperature induced wavelength shift is estimated to be less than about 1 GHz (0.008 nm) over a 200 degree Celsius span. Based on a dual ring model with 200 turns and maximum current I=3000 A, the accuracy of the current measurement can be estimated versus differential length $\Delta L=L_1-L_2$ and wavelength resolution of the interrogation system as shown in FIG. 10. High accuracy of 0.3% can be achieved, for example, using $\Delta L=0.1$ mm and wavelength resolution of 40 pm.

Figure 11:
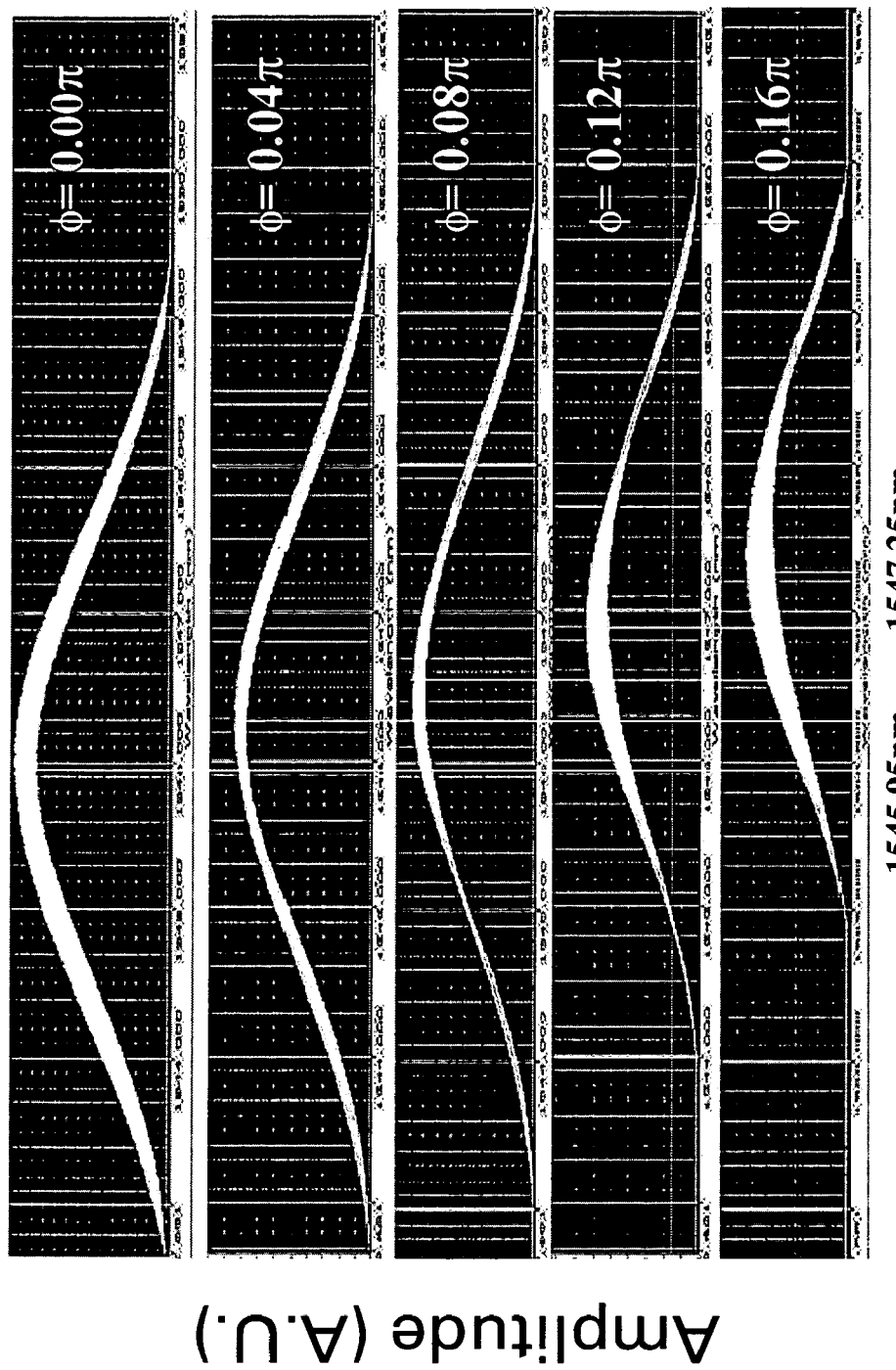
FIG. 11 is a graph illustrating experimental results of wavelength shift vs. phase shift for the example of FIG. 7.
Figure 12:
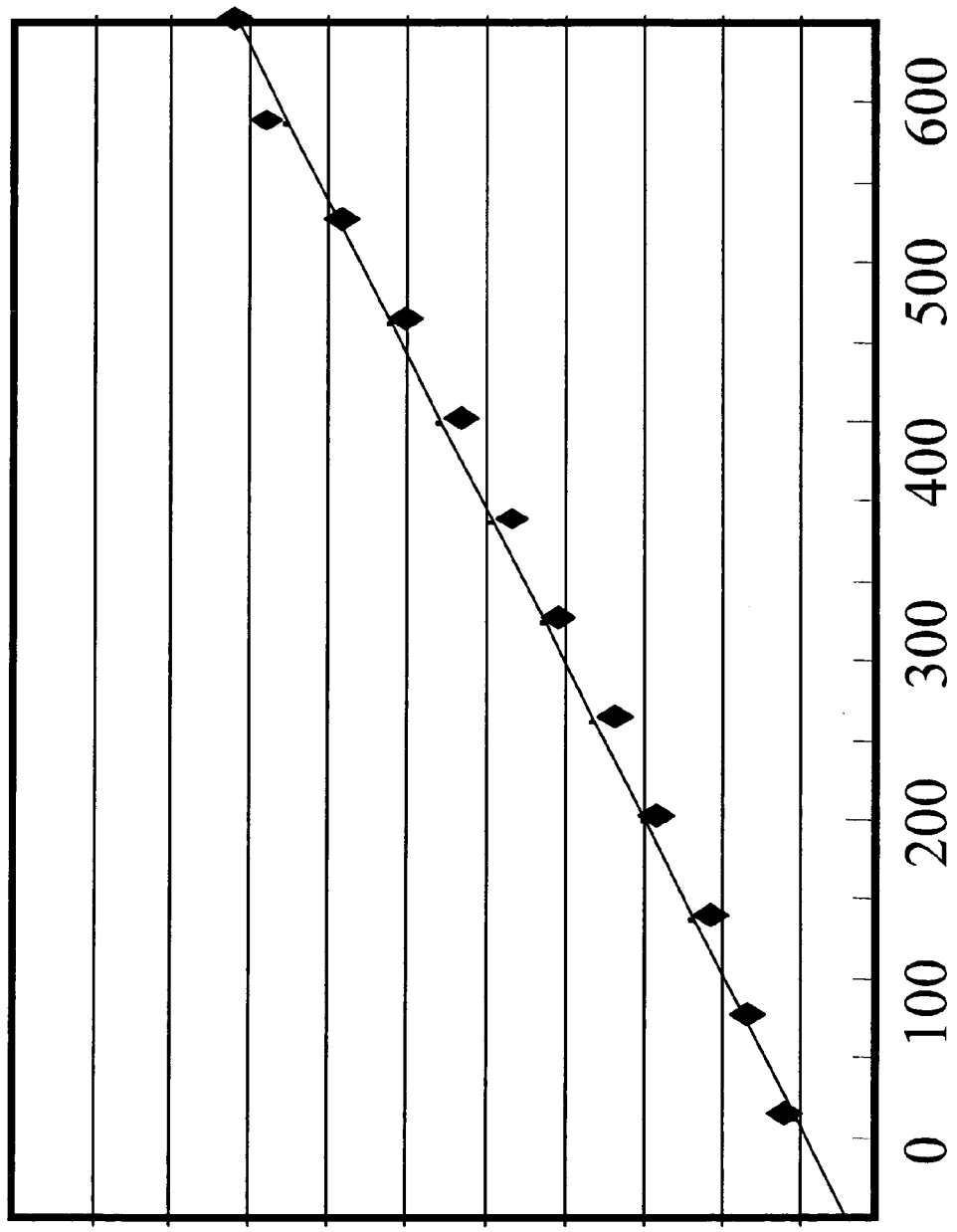
FIG. 12 is a graph illustrating experimental results of current vs. amplitude for the example of FIG. 7.
Figure 13:
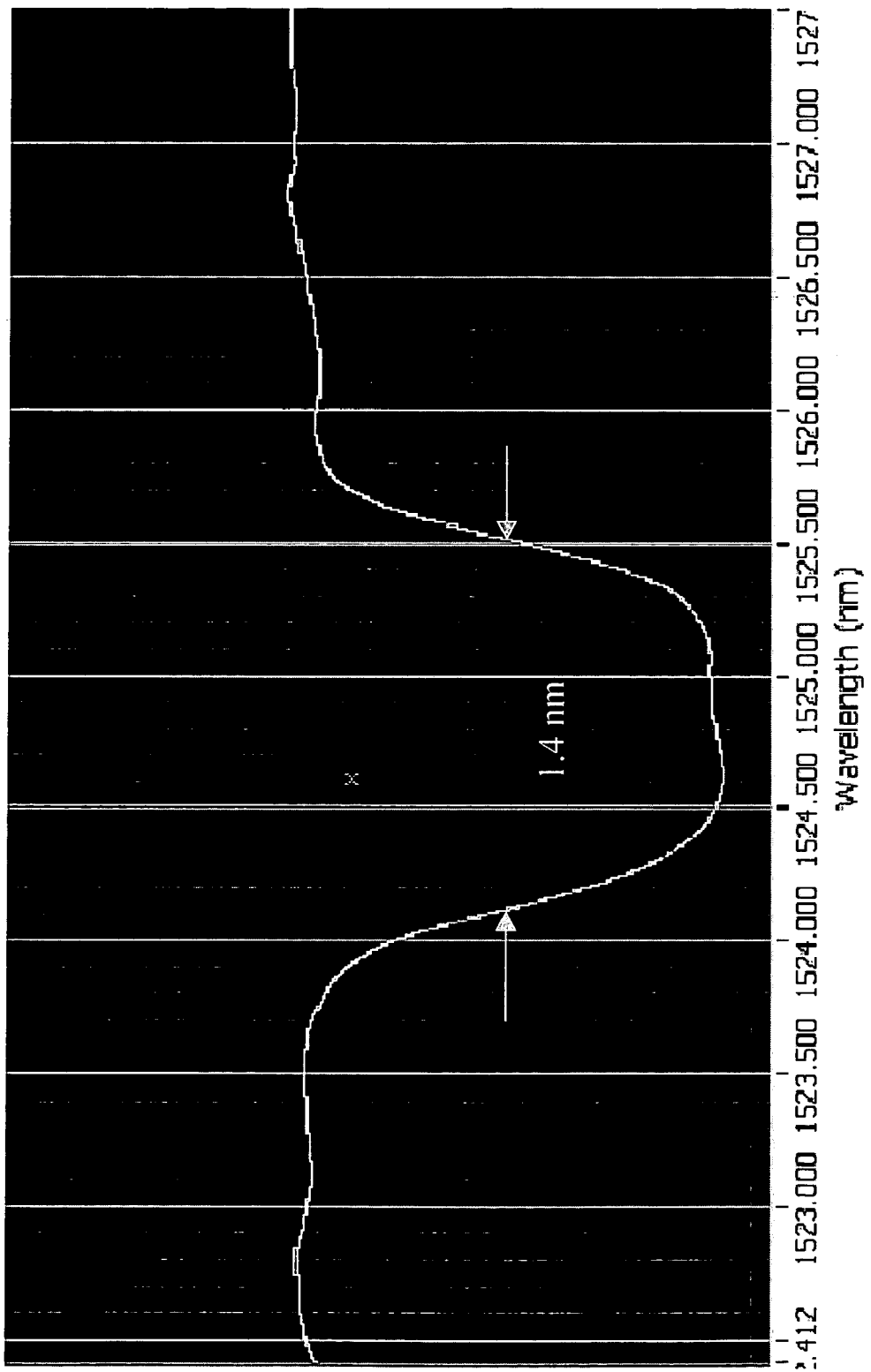
FIG. 13 is a graph illustrating experimental results of a spectrum including a demonstrated channel for the example of FIG. 7.

A system in accordance with one embodiment of the present invention was used to measure a current flowing though a conductor sourced from an Agilent DC power source with variable current output. The current output by the source was variable from 0 Amperes to 700 Amperes. A magneto-optical loop resonator with a sensing element comprising a 120-turn optical fiber coil wrapped around the conductor was used to sense the current flowing through the conductor. A laser diode lasing in the region of about 1545 nm was used as an optical source, and the output used to interrogate the loop resonator. An interrogation system comprising a sweep meter was used to estimate the current. A sweep meter, for example from Precision Photonics, is typically used for sweeping the laser diode output wavelength. A wavelength monitor was used to monitor the wavelength. The resonance frequency of the loop resonator exhibited a wavelength shift of about 1.3 nm (1546 nm to 1547.3 nm) for a non-reciprocal phase shift of about 0.16 π. As the current was varied from about 0 to about 600 amperes, a wavelength shift of about 0.4 nm was observed as shown in FIG. 11. The wavelength shifts were converted to corresponding amplitude shifts using a wavelength filter around the center wavelength, and the current estimated by measuring the amplitudes is shown in FIG. 12. The response is linear within the current measurement range. The potential for multiplexing more wavelength length channels, in the above example, is high due to the over-all available spectrum of 50 nm (from 1520 nanometer to 1570 nanometer), and the demonstrated channel occupying a width of 1.4 nm, as shown in FIG. 13.

The previously described embodiments of the present invention have many advantages, including eliminating polarization components, which consist of one third of the measurement setup being used in the polarimetric current sensors, hence increasing robustness against the environmental noises such as fiber bending and material stress. Sensing in the optical wavelength (frequency) domain allows linear, scalable and precision estimation for a high dynamic range without suffering saturation effects. The system for estimating current of the present invention desirably has a linear response over a large dynamic range.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A system for estimating a parameter selected from the group consisting of a current, a magnetic field, or combinations thereof, the system comprising:
   a resonant frequency tunable magneto-optical loop resonator, wherein the loop resonator comprises a magneto-optical sensing element coupled to an optical waveguide; wherein the loop resonator is configured for receiving an originating optical signal, propagating the originating optical signal in two counter directions, and providing a wavelength modulated signal indicative of the parameter; and
   a processor configured for receiving and processing the wavelength modulated signal to estimate the parameter.

2. The system of claim 1, wherein the sensing element comprises an optical fiber coil comprising at least one looped element.

3. The system of claim 2, wherein the sensing element comprises a plurality of looped elements.

4. The system of claim 2, wherein the optical fiber comprises a doped optical fiber.

5. The system of claim 4, wherein optical fiber comprises Erbium doped fiber.

6. The system of claim 4, wherein the optical fiber comprises Ytterbium doped fiber.

7. The system of claim 1, wherein the sensing element comprises a magneto-optic crystal.

8. The system of claim 1, further comprising at least one ring filter, wherein the loop resonator is coupled to the at least one ring filter.

9. The system of claim 1, wherein the optical waveguide comprises an optical fiber.

10. The system of claim 1, wherein the optical waveguide comprises a thin film waveguide structure.

11. The system of claim 1, further comprising a broadband signal source configured to send the originating optical signal.

12. The system of claim 11, wherein the broadband source is integrated with the processor.

13. A system for estimating a parameter selected from the group consisting of a current, a magnetic field, a change in current, a change in magnetic field, or combinations thereof, the system comprising:
 a plurality of resonant frequency tunable magneto-optical loop resonators, wherein each loop resonator comprises a magneto-optical sensing element coupled to an optical waveguide; wherein the loop resonators are each configured for receiving an originating optical signal, propagating the originating optical signal in two counter directions, and providing a respective wavelength modulated signal indicative of the parameter; and
 a processor configured for receiving and processing the wavelength modulated signal for estimating the parameter.

14. The system of claim 13, wherein the sensing element comprises an optical fiber coil comprising at least one looped element.

15. The system of claim 14, wherein the sensing element comprises a plurality of looped elements.

16. The system of claim 14, wherein the optical fiber comprises a doped optical fiber.

17. The system of claim 16, wherein at least one optical fiber sensing element comprises an erbium doped optical fiber sensing element.

18. The system of claim 16, wherein at least one optical fiber sensing element comprises an ytterbium doped optical fiber sensing element.

19. The system of claim 13, wherein at least one of the sensing elements comprises a magneto-optic crystal.

20. The system of claim 13, wherein at least one of the loop resonators is further coupled to at least one ring filter resonator.

21. The system of claim 13, wherein the waveguide comprises an optical fiber.

22. The system of claim 13, wherein the waveguide comprises a thin film waveguide structure.

23. The system of claim 13, wherein at least two of the loop resonators have different resonant frequencies.

24. The system of claim 13, wherein at least two of the loop resonators have the same resonant frequency.

25. The system of claim 13, wherein the output from at least one of the loop resonators is coupled into at least one other of the loop resonators.

26. The system of claim 13, wherein the system comprises a differential current estimation system.

27. The system of claim 13, wherein the system is configured to sense current at multiple locations of a conductor.

28. The system of claim 13, wherein the system is configured to sense current in multiple conductors.

29. The system of claim 13, wherein the loop resonators are separated by sufficient space along an optical transmission line for time division multiplexing of the respective modulated signals.

30. A distributed current estimation system comprising:
 a plurality of resonant frequency tunable magneto-optical loop resonators with different resonant frequencies, wherein each loop resonator comprises a magneto-optical sensing element coupled to a waveguide;
 wherein each sensing element is configured to sense current flowing in a different conductor;
 wherein the loop resonators are configured for receiving an originating optical signal originating from a broadband source, propagating the originating optical signal in counter directions, and providing a wavelength modulated signal indicative of the estimated currents to a processor configured for receiving and processing the wavelength modulated signal for estimating the parameter.

31. The distributed current estimation system of claim 30, wherein the current measuring system is embodied in a power substation.

32. The distributed current estimation system of claim 30, wherein the current measuring system is embodied in a power monitoring system in a transportation system.

33. A method for estimating a parameter selected from the group consisting of a current, a magnetic field, or combinations thereof, comprising:
 providing at least one frequency tunable magneto-optical loop resonator with a sensing element;
 positioning the sensing element in a magnetic field;
 coupling an originating optical signal from a source into the at least one loop resonator;
 propagating the originating optical signal along two counter propagating directions through two arms of the loop resonator; and
 detecting a wavelength modulated signal from the at least one resonator; and
 processing the wavelength modulated signal for estimating the parameter.

34. The method of claim 33, wherein processing the wavelength modulated signal for estimating the parameter comprises processing for difference current estimation.

35. The system of claim 1, further comprising a plurality of filters, wherein the plurality of filters are coupled to each other and to the loop resonator to enable adjustment of at least one of FSR or finesse of the system.

36. The system of claim 20, wherein the plurality of the loop resonators are a coupled along a single optical loop, wherein the wavelength modulated signal is multiplexed.

* * * * *